United States Patent [19]

Lohninger

[11] Patent Number: 5,691,670
[45] Date of Patent: Nov. 25, 1997

[54] INTEGRATED MICROWAVE-SILICON COMPONENT

[75] Inventor: Gerhard Lohninger, Munich, Germany

[73] Assignee: Siemens Aktiengesellschaft, Munich, Germany

[21] Appl. No.: 721,675

[22] Filed: Sep. 27, 1996

[30] Foreign Application Priority Data

Sep. 29, 1995 [DE] Germany .............. 195 36 431.7

[51] Int. Cl.$^6$ ............... H03B 5/18; H03F 3/04; H03F 3/68; H04B 1/28
[52] U.S. Cl. ............ 331/96; 331/101; 331/117 D; 330/148; 330/311; 455/333
[58] Field of Search ............... 331/74, 96, 99, 331/101, 117 R, 117 FE, 117 D, 116 R, 116 FE, 107 OP, 107 SL, 107 C; 455/333; 330/250, 296, 148, 302, 311

[56] References Cited

U.S. PATENT DOCUMENTS

| | | | |
|---|---|---|---|
| 3,260,960 | 7/1966 | Bangert | 331/74 X |
| 3,271,685 | 9/1966 | Husher et al. | 455/333 X |
| 5,352,992 | 10/1994 | Asazawa | 330/296 X |

FOREIGN PATENT DOCUMENTS

| | | |
|---|---|---|
| 1933 933 | 10/1970 | Germany . |
| 35 90 480 C2 | 6/1995 | Germany . |

*Primary Examiner*—David Mis
*Attorney, Agent, or Firm*—Hill, Steadman & Simpson

[57] ABSTRACT

The circuit employs two bipolar transistors, five resistors and a capacitor and can be primarily utilized as a broadband pre-amplifier and also as an oscillator or a mixer. A first transistor is connected to the circuit input and ground. A second transistor is connected to the collector of the first transistor and the supply voltage. One circuit output is connected to the second transistor. Another circuit output is connected to the first transistor via a resistor. The emitter of the first transistor is connected to the second transistor via a second resistor. A third resistor is connected between the base and collector of the first transistor. A fourth resistor is connected between the base and collector of the second transistor.

13 Claims, 4 Drawing Sheets

INTEGRATED MICROWAVE-SILICON COMPONENT

BACKGROUND OF THE INVENTION

1. Field of the Invention

The invention is directed to an integrated microwave-silicon component with a transistor circuit.

2. Description of the Related Art

A number of different silicon MMIC components (Microwave Monolithic Integrated Circuit) are known. A new component design is usually developed for each application, each being more or less complicated in structure and matched to the respective purpose.

SUMMARY OF THE INVENTION

The invention provides a versatile microwave component that has an especially beneficial design.

An object of the inventive circuit design is to create a universal component that can be utilized as a low-noise (50 ohm) broadband pre-amplifier, as well as an oscillator or a mixer.

It is a further object to create a versatile circuit design that is cost effective in view of the mask layout and the testing technology. A number of possible applications for this component are possible depending upon the user's requirements.

Another object of the invention is to encapsulate the component in a small dimensioned microwave plastic housing. As a result of the inventive design of the component, only a small number of external components is necessary for the various applications.

These objects are inventively achieved in a component in which a first transistor having a base connected to the circuit input and an emitter connected to the ground, a second transistor having a base connected to the collector of the first transistor and a collector connected to the supply voltage. A first circuit output is connected to the emitter of the second transistor, and a second circuit output is connected to the collector of the first transistor via a resistor. The emitter of the first transistor is connected to the second transistor via a second resistor, a third resistor is connected between the base and the collector of the first transistor, and a fourth resistor is connected between the base and the collector of the second transistor.

It is a further object of the invention to improve the input matching capability of the component. This is achieved by connecting a RC element between the base and the collector and the first transistor.

It is still a further object of the invention to produce a low-noise broadband amplifier at the circuit outputs. This may be accomplished by connecting the first or the second circuit output with a capacitor. A low-noise broadband amplifier may also be obtained by connecting a resistor to the first circuit output and measuring the corresponding amplified radio frequency. Another possible means to obtain the low-noise broadband amplifier is by implementing an additional resistor at the second circuit output and then measuring the amplified radio frequency signal downstream from the additional resistor.

In another preferred application, the inventive component can be employed as a mixer. This is accomplished by supplying a local oscillator at the first circuit output. An intermediate frequency is taken at the tap point of the upper voltage potential via a matching network and a bias is applied via a coil.

An oscillator application is also possible with the inventive component. A feedback to the circuit input is produced via the second circuit output and the oscillator output is measured at the first circuit output via a capacitor.

DETAILED DESCRIPTION OF THE PREFERRED EMBODIMENTS

Figure 1:
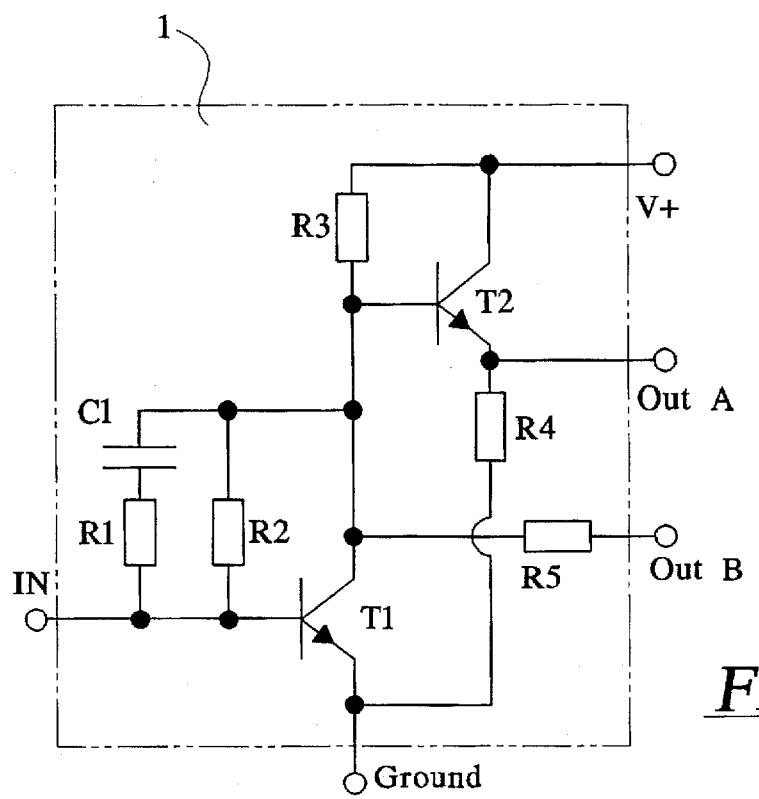
FIG. 1 is a schematic circuit diagram of the inventive component.

A microwave-silicon component 1 according to the invention is shown in FIG. 1. The broken line illustrates what elements are arranged within the encapsulated component 1. The circuit concept provides five free terminals, namely a circuit input IN, a first and a second circuit output out-A and out-B, and a terminal V+ (at which a supply voltage or bias voltage can be applied) and a ground terminal. The component 1 includes two bipolar transistors T1, T2, five resistors R1, R2, R3, R4, R5 and a capacitor C1. The resistor R1 and the capacitor C1 form an RC element to improve input matching. The operating point for the transistor T1 is determined by the resistor R2. The resistor R3 first is used and serves as a collector resistor for the transistor T1. Secondly, the resistor R3 is used and serves as an HF (high frequency) feedback for the transistor T2, and simultaneously sets the operating point for the second transistor T2. The resistor R4 has a plurality of functions and serves, first, as an emitter resistor for the second transistor T2. Secondly, the resistor R4 serves as a DC and HF feedback. High temperature stability is achieved by the resistors R2, R3 and R4. The resistor R5 represents an optional feedback resistor. The component 1 is suitable for operating voltages from 2 volts through 5 volts. This broad voltage range is enabled by the inventive circuit design.

The amplification path of the first transistor T1 lies directly at the lower potential terminal, this corresponding to ground in the illustrated example. The amplification path of the second transistor T2 is applied to ground via the resistor R4. The base of the first transistor T1 lies directly at the circuit input IN. The base of the second transistor T2 and the collector of the first transistor T1 are connected to the circuit input IN via the resistor R2.

In the following figures, the circuit in the inside of the box corresponds to the circuit described in FIG. 1. The five terminals IN, V+, ground, OUT-A, and OUT-B enable the four pre-amplifier applications described in the Figures below having different gain, matching and output power values, as well as a mixer application and an oscillator application.

Figure 2:
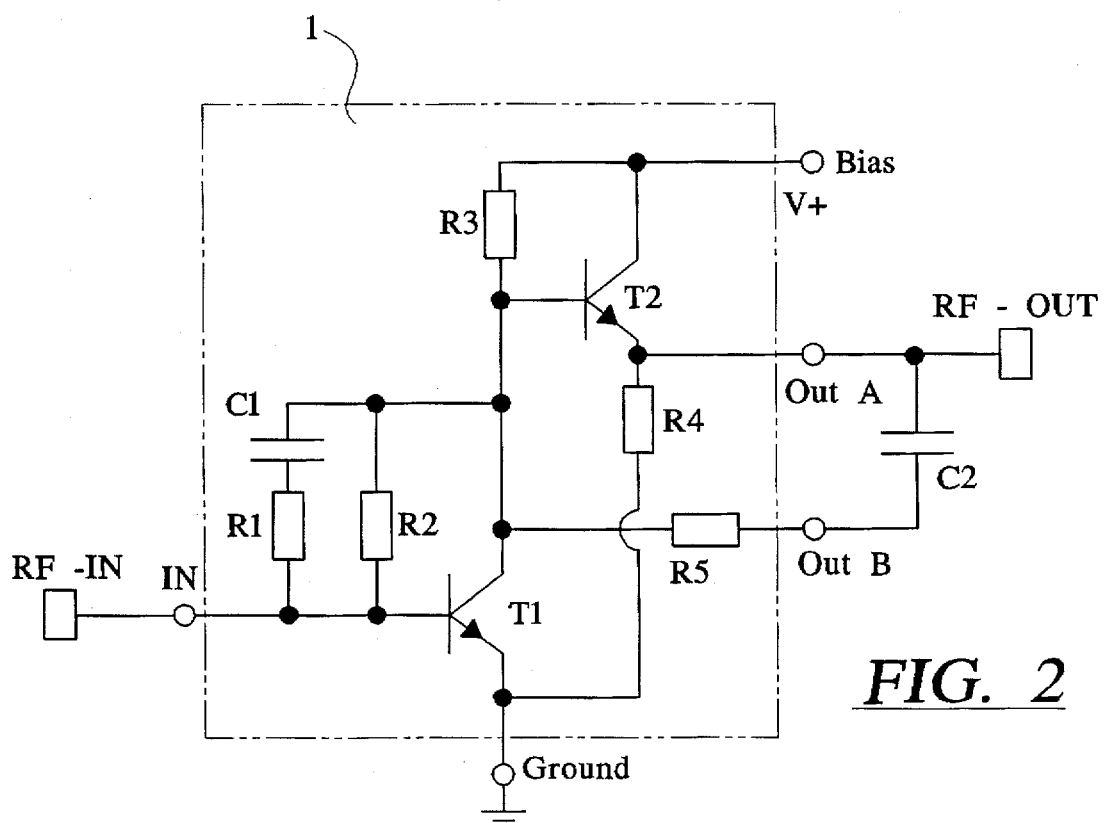
FIG. 2 is a schematic circuit diagram of a first version of a low-noise broadband amplifier.

A first version of a low-noise broadband amplifier is shown in FIG. 2. A capacitor C2 is connected between the two circuit outputs out-A and out-B. A radio frequency signal RF-IN is supplied at the circuit input IN. The input matching at the input IN is optimum at a frequency range between 1 GHz and 3 GHz. The amplified radio frequency output signal is provided at the location referenced RF-OUT.

Figure 3:
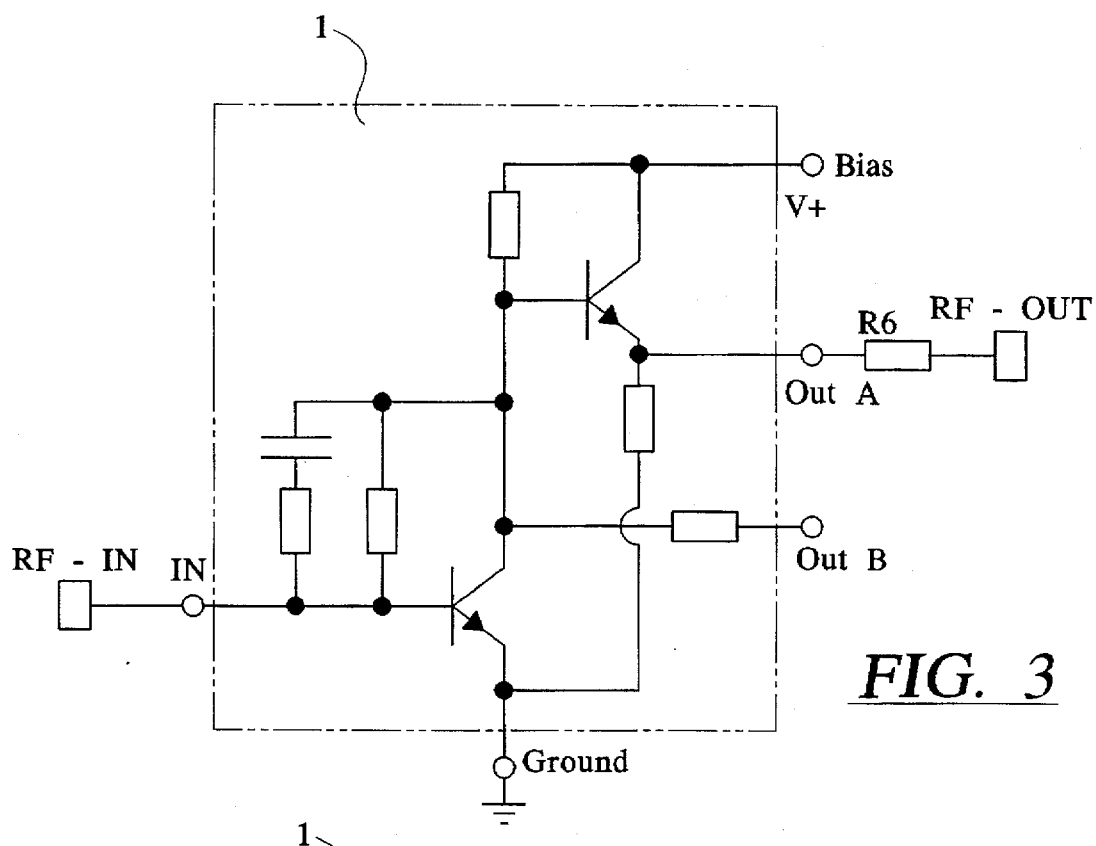
FIG. 3 is a schematic circuit diagram of a second version of a low-noise broadband amplifier.

FIG. 3 shows a second version of a low-noise broadband amplifier. The feed of the radio frequency input signal RF-IN is supplied to the circuit input IN in the same way as in the first version shown in FIG. 2. The output results at the first circuit output OUT-A via a serial low-impedance resistor R6. The input matching at the circuit input IN is optimum at a frequency range between 50 MHZ and 1.5 GHz.

Figure 4:
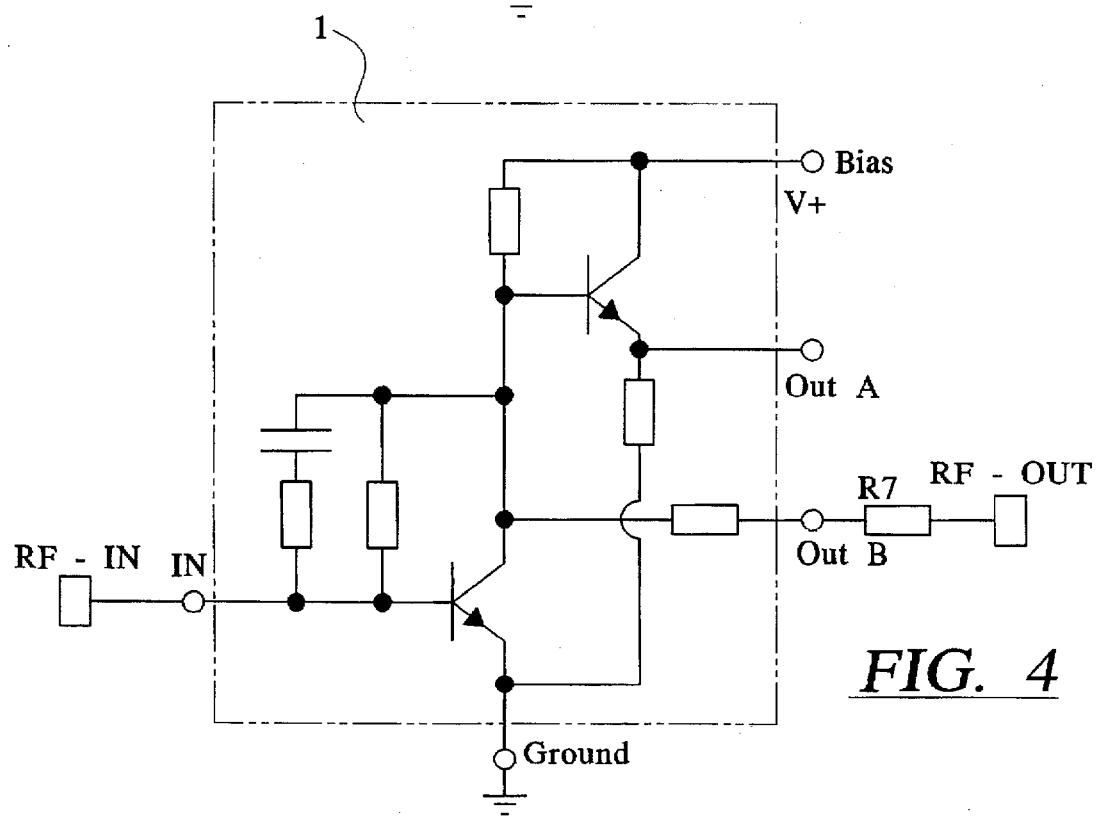
FIG. 4 is a schematic circuit diagram of a third version of a low-noise broadband amplifier.

A third version of a low-noise broadband amplifier is shown in FIG. 4. In this third version, a low-impedance resistor R7 is connected to the second circuit output OUT-B to improve the output matching.

Figure 5:
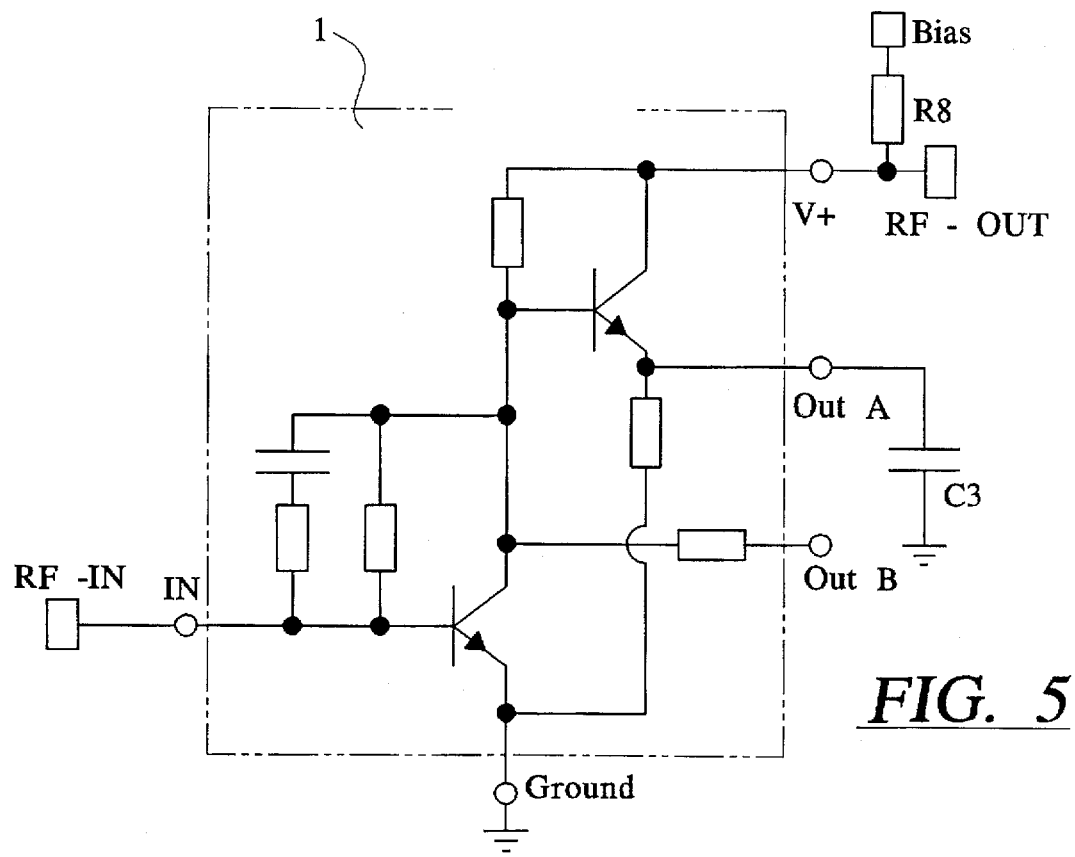
FIG. 5 is a schematic circuit diagram of a fourth version of a low-noise broadband amplifier.

The fourth version of the low-noise broadband amplifier is shown in FIG. 5. This version is distinguished by high gain that is dependent on the size of a capacitor C3 that is connected between the first circuit output OUT-A and ground. The amplified signal is taken at the voltage potential port V+ at which the voltage supply is also provided via a resistor or a coil R8.

Figure 6:
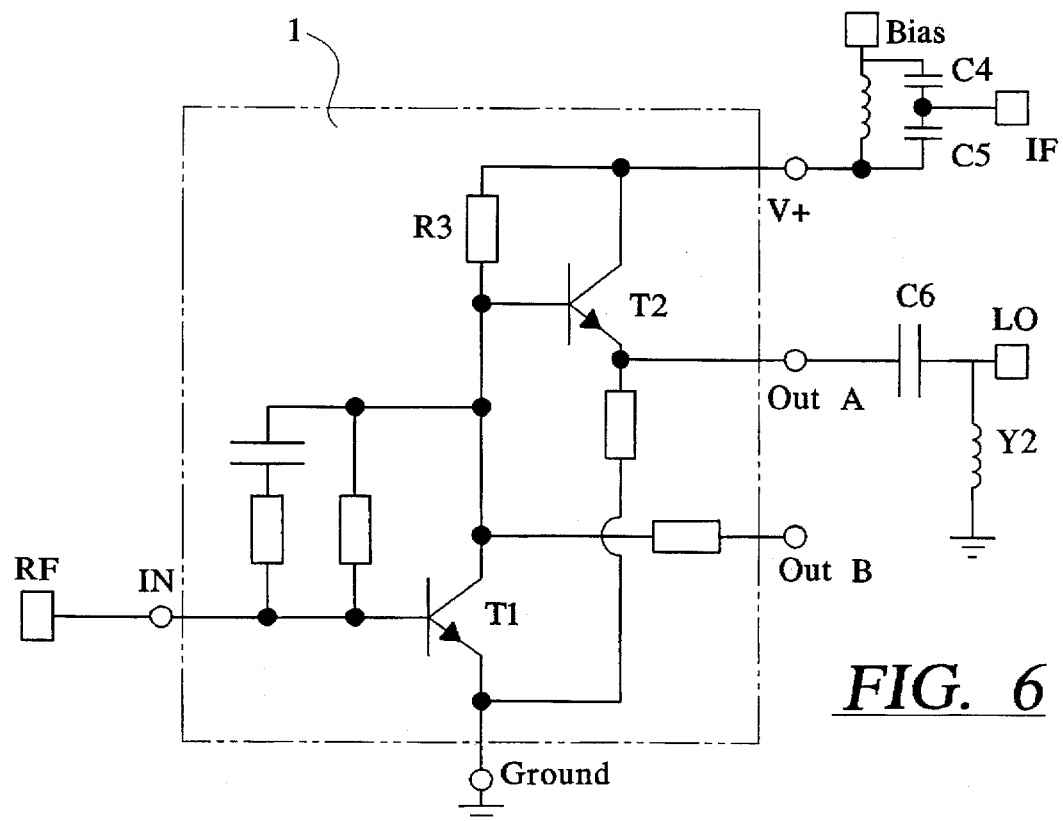
FIG. 6 is a schematic circuit diagram of a mixer application.

A mixer application is shown in FIG. 6. The emitter injection serves as a basis of this mixer application. A local oscillator LO is supplied at the first circuit output OUT-A and to the emitter of the second transistor T2. The pre-amplifier with the first transistor T1 reduces the mixer noise factor and increases the overall gain. The resistor R3 can be optionally omitted in the mask layout and the operating voltage of the first transistor T1 can be supplied via the second circuit output OUT-B. The intermediate frequency can be taken at the voltage potential port V+ via a matching network with two capacitors C4, C5. An inductor Y1 for the biasing serves as a resonance element. The two capacitors C4, C5, between which the intermediate frequency IF is taken, are connected in series and are parallel to the inductor. A capacitor C6 is provided at the first circuit output OUT-A. The local oscillator LO is connected to the capacitor C6 and a grounded inductor Y2 is tapped from between the capacitor C6 and local oscillator LO.

Figure 7:
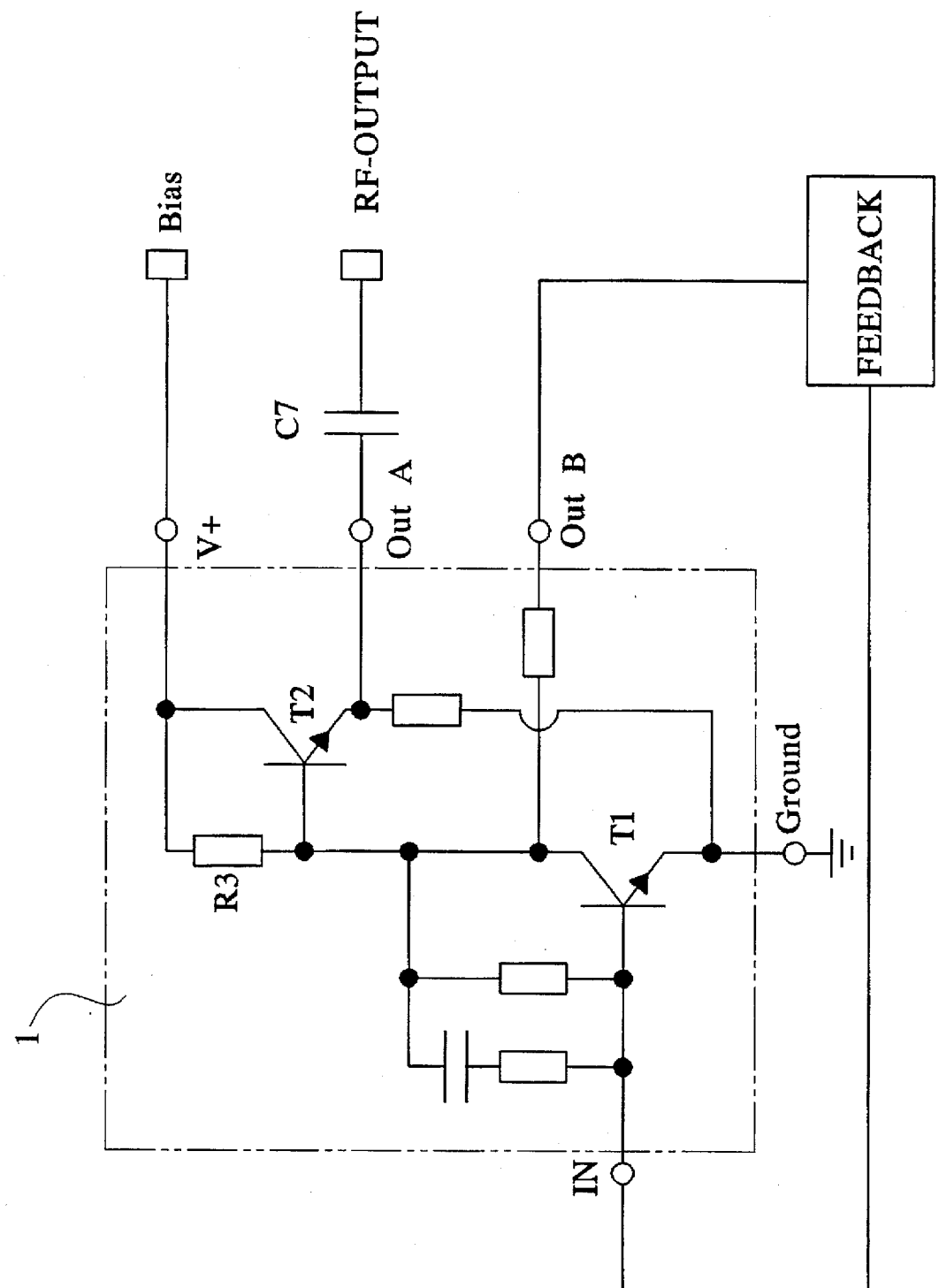
FIG. 7 is a schematic circuit diagram of an oscillator application.

An oscillator application is shown in FIG. 7. A particular advantage of this application is the buffering of the component at the first circuit output OUT-A, shown here by a capacitor C7. This is accomplished by the emitter follower with the second transistor T2. The feedback structure is a parallel feedback dependent on the frequency or, as shown here, is a serial feedback. Dielectric or coaxial resonators are employed for this purpose. A low-impedance resistor R4 can be connected to ground at the first circuit output OUT-A for raising the operating current of the transistor T2 and for raising the output power.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

What is claimed is:

1. An integrated microwave-silicon component having a circuit input, a voltage supply and a ground, said component comprising:

a first transistor having a base, an emitter and a collector, said base connected to the circuit input, and said emitter connected to the ground;

a second transistor having a base, an emitter and a collector, said base connected to said collector of said first transistor, and said collector connected to the voltage supply;

a first circuit output connected to said emitter of said second transistor;

a second circuit output connected to said collector of said first transistor via a first resistor;

said emitter of said first transistor connected to said emitter of said second transistor via a second resistor;

a third resistor connected between said base and said collector of said first transistor; and a fourth resistor connected between said base and said collector of said second transistor.

2. The integrated microwave-silicon component according to claim 1, further comprising:

an RC element connected between said base and said collector of said first transistor.

3. The integrated microwave-silicon component according to claim 1, wherein said component connected to operate as an amplifier.

4. The integrated microwave-silicon component according to claim 3, further comprising:

a capacitor connected between said first and said second circuit outputs.

5. The integrated microwave-silicon component according to claim 3, further comprising:

a serial resistor having a first side and a second side, said first side connected to said first circuit output and said second side being an output from which is available an amplified voltage.

6. The integrated microwave-silicon component according to claim 3, further comprising:

a serial resistor having a first side and a second side, said first side connected to said second circuit output and said second side being an output from which is available an amplified voltage.

7. The integrated microwave-silicon component according to claim 3, further comprising:

a capacitor connected between said first circuit output and ground; and circuit means connected to said voltage supply to provide an amplified signal.

8. The integrated microwave-silicon component according to claim 7, wherein said circuit means further comprises:

a resistor having a first side and a second side, said first side connected to said voltage supply and said second side connected to a bias.

9. The integrated microwave-silicon component according to claim 1, further comprising:

circuit means connected to said component to operate as a mixer.

10. The integrated microwave-silicon component according to claim 9, wherein said circuit means comprises:

a local oscillator supplied at said first output;

a capacitor connected between said local oscillator and said first output;

an inductor having a first and a second lead, said first lead tapped from between said capacitor and said local oscillator and said second lead connected to ground; and a matching network provided at the voltage potential for measuring an intermediate frequency.

11. The integrated microwave-silicon component according to claim 10, wherein said inductor is a first inductor and said capacitor is a first capacitor, and the matching network further comprises:

a second inductor;

second and third capacitors connected in series, said second and third capacitors being connected in parallel to said inductor.

12. The integrated microwave-silicon component according to claim 1 further comprising:

circuit means connected to said component to operate as an oscillator.

13. The integrated microwave-silicon component according to claim 12, wherein said circuit means comprises:
a feedback connected between said circuit input and said second circuit output; and
a capacitor having a first side and a second side, said first side connected to said first circuit output and said second side being an output from which is available an oscillator output signal.

* * * * *